United States Patent [19]

Bost

[11] 4,078,160

[45] Mar. 7, 1978

[54] PIEZOELECTRIC BIMORPH OR MONOMORPH BENDER STRUCTURE

[75] Inventor: Jonathan Robert Bost, Palatine, Ill.

[73] Assignee: Motorola, Inc., Schaumburg, Ill.

[21] Appl. No.: 812,537

[22] Filed: Jul. 5, 1977

[51] Int. Cl.² .................. H04R 17/00; H01L 41/04; H01L 41/10; H01L 41/22

[52] U.S. Cl. .................. 179/110 A; 310/331; 310/332; 310/363; 310/364

[58] Field of Search .......... 179/110 A; 310/331, 310/332, 363, 364, 365, 366

Primary Examiner—George G. Stellar
Attorney, Agent, or Firm—James P. Hamley; James W. Gillman

[57] ABSTRACT

A woven mesh of conductively coated stiff filaments is affixed between a first element deformable in response to an applied electronic signal and a second element which has substantially the same configuration as the first element and which may be electrically deformable also. The mesh serves as a center vane between two elements which allows the bender elements to move relative to each other. The bender is supported by peripheral tabs extending from the mesh. A bender structure is produced by coating a woven mesh of conductively coated filaments with an uncured solid epoxy. The mesh and two transducer elements are assembled together and heat and pressure applied to melt and then cure the epoxy, causing the conductive mesh material to make contact with and adhere to the faces of the transducer elements.

18 Claims, 4 Drawing Figures

PIEZOELECTRIC BIMORPH OR MONOMORPH BENDER STRUCTURE

BACKGROUND OF THE INVENTION

1. Field of the Invention

This invention relates generally to transducers having elements deformable in response to an applied electronic signal. In particular, this invention relates to an improved transducer of the bender type.

2. Description of the Prior Art

Bender transducers are well known in the prior art. For example, a piezoelectric bender for use as an acoustic transducer and mounted at the apex of a speaker cone is described in U.S. Pat. No. 3,548,116 issued to Hugo W. Schafft and assigned to the assignee of the present invention. A bimorph transducer element is described as being formed by two piezoelectric wafers which are fastened together by a metal shim which stiffens the bimorph structure and forms an electrode between the two wafers. A second U.S. Pat., No. 3,629,625, issued to the same inventor and assigned to the same assignee describes a center vane having corregations with the apices of the corregations cemented to the surfaces of the piezoelectric elements. The corregated portion of the center vane acts as a stiff hinge permitting movement of the piezoelectric elements relative to each other.

Piezoelectric elements for bender transducers in the prior art utilize thin, circular discs of piezoelectric material, each disc having flat opposing major surfaces with very thin electrodes deposited thereupon. The piezoelectric disc elements are polarized by applying an appropriate polarizing potential between opposite surfaces. Polarization of these elements aligns the electric dipoles in the material in a preferred direction. In operation, an electric potential is applied between the plates of a piezoelectric element which may either aid or oppose the polarization of the material. If the applied potential aids polarization the thin wafer will tend to increase slightly in the thickness dimension and to decrease slightly in the radial dimension. Conversely, if a voltage potential is applied which opposes the polarization of the piezoelectric element, the element will tend to slightly decrease its thickness dimension and to slightly increase its radial dimension. Thus, the thickness of a piezoelectric element can be controlled by an externally applied control potential.

When used in a single piezoelectric element bender, the piezoelectric disc is held in a fixed relationship with respect to a piezoelectrically inactive member. When the piezoelectric disc expands and contracts due to the voltage applied thereto, the piezoelectric disc and the piezoelectrically inactive disc bend and produce sound pressure waves in response to the applied signal voltage. Similarly, acoustic energy applied to the bender element will cause a resultant signal potential to be developed between the piezoelectric disc conductive faces.

In many prior art applications bilayer bender devices utilizing two piezoelectric wafers have been provided each wafer having thin conductive electrodes deposited on the faces thereof. A conductive center vane is provided for stiffly securing the piezoelectric wafer together and to provide an electrode between the inner faces of the piezoelectric wafers. The wafers are polarized and electrically connected such that one of the wafers expands radially outward while the other wafer contracts radially inward in response to a given potential being applied between the electrodes of each. This causes the assembly to have a bimorph action and to bend in an axial direction along the diameters of the wafers, causing the wafer to dish as one element expands and the other element contracts. Conversely, when acoustic energy is applied to a two layer bender, a piezoelectric voltage is generated.

A solid metal plate used as a center vane between two piezoelectric wafers, or between one piezoelectric wafer and a piezoelectrically inactive member provides good coupling between the elements in a radial direction but is too inflexible in the direction of bending, resulting in a lossy, inefficient structure. Corregated center vanes of the prior art have been stamped metal parts, requiring precise dimensional control and expensive tooling.

Prior art methods of supporting piezoelectric bender structures and diaphram cones have been limited to fastening the apex of the diaphram cone to the center of one of the piezoelectric disc elements. Since the mass of the piezoelectric bender structure is much greater than the mass of the diaphram cone and the load of the air mass driven by the diaphram cone, acoustic energy at higher frequencies will be radiated, or received, with higher efficiency at higher frequencies. This is because the momentum of the bender, being proportional to mass times the velocity, becomes less as the audio frequency decreases, the audio frequency determining the velocity.

SUMMARY OF THE INVENTION

It is, therefore, an object of this invention to provide an improved bender transducer.

Another object of this invention is to provide an intermediate spacer for a bender having one or more electromechanical transducers activated by an electrical signal which provides rigidity in a radial direction and flexibility in the direction of bending.

It is another object of the invention to provide a center vane for an electromechanical transducer which is easily fabricated and assembled.

In practicing the invention, an improved bender transducer is provided having a first and a second element, each element having a conductive interface surface portion. According to one aspect of the invention one of the elements is deformable in response to an applied electronic signal and another of the elements has substantially the same dimensions as the first element. A woven mesh of conductively coated stiff filaments is provided for mounting between the interface portion of the first and the second elements so that the conductive mesh is in contact with the elements coupling the elements together. According to one aspect of the invention, the electromechanical transducer element is selected from the group consisting of magnetostrictive, piezoelectric, and electrostrictive transducers. According to another aspect of the invention, the second element has the same electromechanical characteristics as the first element. According to another aspect of the invention, the transducer is formed from a first and second elements which are thin piezoelectric discs, each having a first and a second axially opposing face with conductive electrodes deposited thereon. According to another aspect of the invention, peripherally extending portions of the mesh are provided for mounting of the bender element. A method for making a bender transducer is disclosed and includes the steps of coating a woven mesh of stiff filaments with an uncured solid epoxy, the mesh having a conductive layer deposited thereon. The mesh is then assembled between a pair of piezoelectric elements each having opposing flat faces with electrodes deposited thereon. Heat and pressure are applied to the combination to melt the epoxy and to cause filaments of the conductive mesh to contact the faces of the piezoelectric elements. Continued heat and pressure cure the epoxy holding the piezoelectric elements tightly coupled together.

BRIEF DESCRIPTION OF THE DRAWINGS

For a more complete understanding of the invention, reference is made to the drawings in which.

DESCRIPTION OF THE PREFERRED EMBODIMENT

Figure 1:
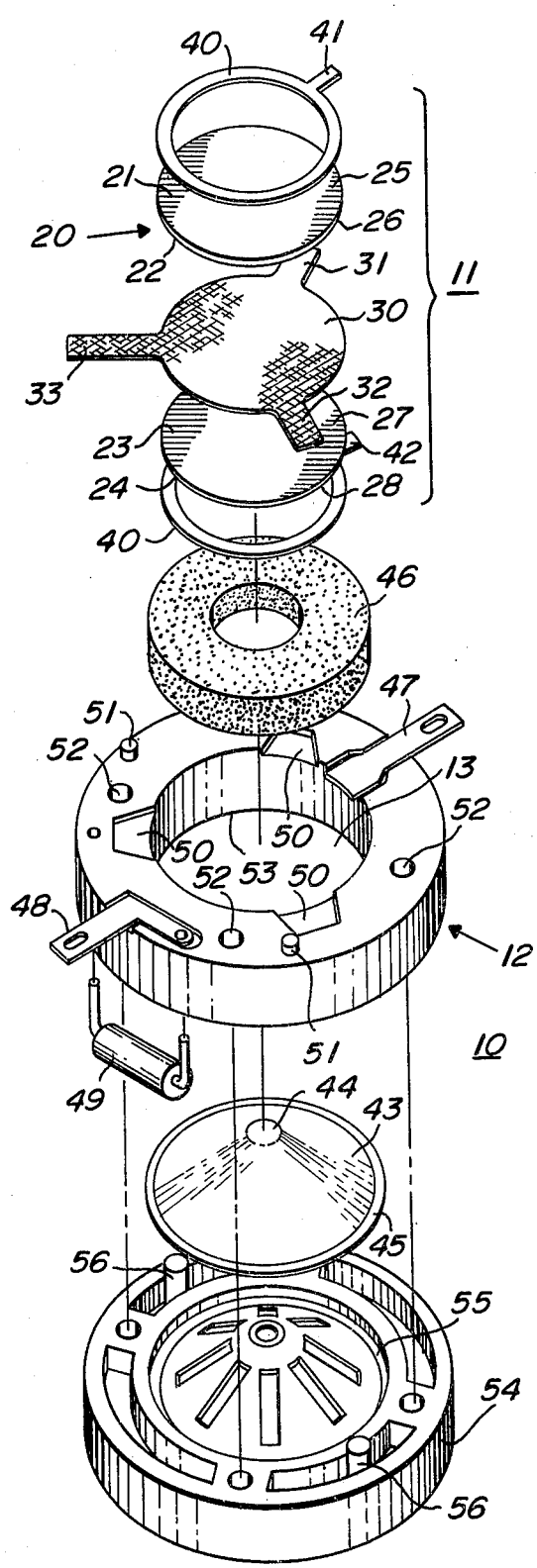
FIG. 1 is an exploded, perspective view of a speaker assembly according to the invention.
Figure 2:
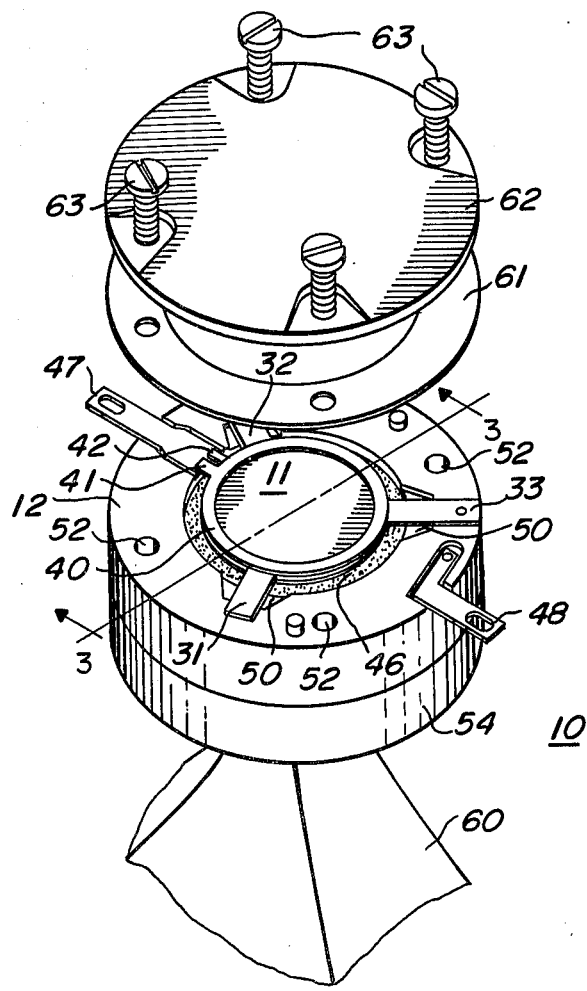
FIG. 2 is an assembled, partially exploded perspective view of the speaker assembly of FIG. 1.

Referring to FIG. 1 of the drawings, a speaker assembly 10 is shown using a bender structure 11. FIG. 2 shows the bender structure 11 assembled to a mounting ring 12.

The bender structure 11 in the preferred embodiment includes a pair of ceramic piezoelectric thin discs 20 each having a pair of flat opposing faces 21, 22, 23, 24. Each of the discs is formed from a piezoelectric ceramic material and has a diameter of 1.25 inches and a thickness of 0.005 inch. A very thin conductive layer 25, 26, 27, 28 is formed on each of the disc faces 21, 22, 23, 24, providing a means for applying a voltage potential (not shown) between the faces of each of the discs. The preferred embodiments has electromechanical transducer elements which are piezoelectric; however, suitable electromechanical transducer elements having magnetostrictive and electrostrictive characteristics may also be used. It is also noted that one of the discs 20 may be an electromechanically inactive device which provides support for a single electromechanically active device, as is well known in the art. Generally, more efficient transducer bender elements use two active transducer elements as described in this preferred embodiment, but the invention is not limited thereto.

Figure 3:
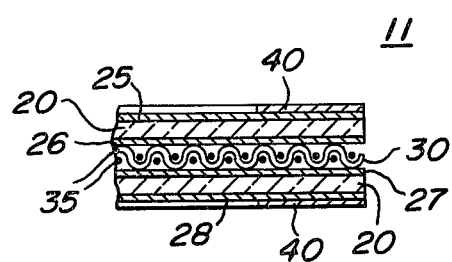
FIG. 3 is an expanded scale sectional view taken along section line 3—3 of FIG. 2.
Figure 4:
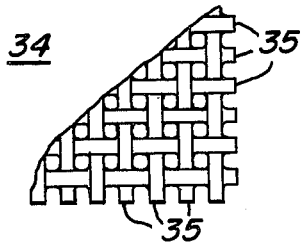
FIG. 4 is an expanded scale plan view of a mesh material utilized in the invention.

A woven mesh member 30 having a generally circular configuration of approximately the same dimensions as the piezoelectric discs 20 is shown in FIG. 1 between the piezoelectric discs 20. Extending from the main body of the woven mesh 30 are three mounting tabs 31, 32, 33, provided for attaching the bender structure 11 to the mounting ring 12. FIG. 3 shows on an enlarged scale the components of the bender structure 11. A detailed view of the woven mesh 30 structure 34 is shown in FIG. 4. The structure is formed by interweaving monofilament polyester threads 35 as shown in plan view in FIG. 4 and as shown in a sectional side view in FIG. 3. A uniform nickel coating is provided on the polyester filament mesh. The filaments are relatively stiff polyester threads and the metal coating process imbeds the polyester threads in metal and slightly fuses the threads at the cross-over points. Tetko Inc. of Elmsford, N.Y., produces a metallized polyester screen material designated as M-85 which has a thickness of 0.0048 inch and is suitable for use as a piezoelectric bender center vane mesh material.

FIG. 3 shows an exploded detail view of a cross section of an assembled bender structure. When the woven mesh 30 is assembled with the piezoelectric discs 20 the metallized fibers 35 contact the thin conductive layers 26, 27 on the inner surfaces of the discs 20 and provide electrical connections therewith. An epoxy resin bonds the woven mesh 30 to the discs 20. It is not necessary that the epoxy resin contain conductive material because the mesh directly contacts the conductive layers on the disc faces. The overall structure thereby formed by the woven mesh 30 and the discs 20, because of the strength of the polyester filaments, is relatively stiff and resistant to movement in the radial direction. In the direction of bending, because the bender structure 11 is very thin, flexing or bending movement is quite easily obtained. These characteristics are quite desirable in a bender transducer in which it is desirable that the piezoelectric disc or discs be tightly coupled in the radial direction but that bending be allowed for efficient transducer action.

Referring to FIG. 1, a pair of conductive thin foils 40 are provided which are fastened to the peripheral portions of the outer faces 21, 24 of the piezoelectric discs 20 with conductive glue means. The conductive foils are made of any suitable conductive material, such as for example aluminum or copper. Tab portions 41, 42 are provided on the conductive foils 40 for making suitable connections to external circuitry. FIG. 3 shows an expanded scale cross-sectional view of an assembled bender structure 11 including the conductive foils 40.

The speaker assembly 10 includes a diaphram cone 43 having a somewhat flattened apex portion 44 and a peripheral edge portion 45. The apex portion 44 is in this particular embodiment fixed to the center of one of the disc faces 24. The bender structure 11 provides drive for the cone 43 which in this particular embodiment is part of a speaker assembly. It is noted that the structure shown and described contemplates using the bender structure 11 as part of a speaker assembly; however, the bender structure 11 is suitable for use, for example, as a microphone element or in other transducer applications, as are well known in the art, and this specification is not intended as limiting the invention to a particular embodiment or application.

An annular-shaped member 46 is utilized to lightly dampen resonances in the cone 43. The annular-shaped member 46 is contained within the mounting ring 12 in an interior bore 13 thereof. The mounting ring 12 is formed from a suitable material such as a moldable synthetic plastic. Terminals 47, 48 are provided on the mounting ring 12 for appropriate electrical connections to external circuitry. Three shallow cavities 50 are provided on an upper surface of the mounting ring 12 adjacent to the center bore 13 providing clearance for movement of portions of the mounting tabs 31, 32, 33 of the woven mesh 30. Locating pins 51 and screw clearance apertures 52 are also provided on the mounting ring 12. On the lower surface of the mounting ring 12 is provided a lip 53 which is positioned around the edge of the center bore. The peripheral edge 45 of the cone 43 rests and is contained against the lip 53. A diverter 54 has an interior ring shaped portion which matches the peripheral edge 45 of the cone 43 and in conjunction with the lip 53 of the mounting ring 12 captivates the peripheral edge of the cone 43 when the mounting ring 12 and the diverter 54 are assembled together. Guide pins 56 which mate with cavities (not shown) in the mounting ring 12 are provided for alignment of the diverter 54 with the mounting ring 12. A series loading resistor 49 is also contained within the mounting ring.

Referring to FIG. 2 of the drawings, the speaker assembly 10 is shown together with a portion of an impedance matching horn 60, connected thereto, a gasket 61, a rear cover plate 62, and a plurality of fastening screws 63. The bender structure 11 which includes the woven mesh 30, a pair of piezoelectric discs 20, and the conductive foils 40, all bonded together to form an integral unit is affixed to the mounting ring 12 at the top surface 14 of the mounting ring 12 by the mesh mounting tabs 31, 32, 33, which are, for example, clamped at locations adjacent to the shallow cavities 50, said locations being located away from the center bore of the mounting ring 12. The shallow cavities 50 provide clearance for portions of the mounting tabs 31, 32, 33 when the bender structure moves in response to applied excitation voltages. In the assembled configuration, the resilient annular-shaped support member 46 is positioned adjacent to the exterior surface of the cone 43 and lightly dampens the bender structure 11 with respect to the cone 43. The tabs 41, 42 of the conductive foils 40 are soldered to the terminal 47, providing electrical contact between and to the outer faces 21, 24 of the piezoelectric discs 20. The tab 33 has an extended portion with a hole therein for making a solder connection to a lead of resistor 49. The other lead of the resistor 49 is soldered to terminal 48. The bender structure 11 is supported by the mounting tabs 31, 32, 33 being clamped to the top surface 14 of the mounting ring 12 as described hereinbelow. The bender structure 11 is also supported by being affixed to the apex 44 of the cone 43, the cone 43 peripheral edge 45 being clamped between the ring shaped portion 55 of the diverter 54 and the lip 53 of the mounting ring 12 (shown in FIG. 1). The mounting tabs 31, 32, 33 provide additional support for the bender structure 11, particularly at lower frequencies when the momentum of the bender structure 11 diminishes and the transducer efficiency drops. Using the tabs in this manner increases the efficiency of the speaker assembly at the lower frequencies. The annular gasket 61 provides a seal between the top surface 14 of the mounting ring 12 and the rear cover plate 62, which is fastened to the mounting ring 12 by the four fastening screws 63.

The bender structure 11 shown in FIG. 1 and in more detail in FIG. 3 is produced by a process which includes coating the woven mesh (shown in detail in FIG. 4) with an epoxy. The woven mesh is formed from polyester filaments which are nickel plated with the mesh being held to a precise thickness, in the preferred embodiment of this invention to 0.0048 inch. The mesh material is then coated on both sides with a nylon polymide base epoxy solution which dries to an intermediate form concentrated on two surfaces of the mesh material. The discs 20 are then placed in contact with the mesh material and the assembly is cured under heat and pressure which causes the epoxy to melt somewhat and flow, and finally cure allowing the peaks of the mesh to make contact with and hold to the electrodes deposited on the inner faces of the discs 20. The basic mesh material is produced in roll form and the configuration of the woven mesh 30 is obtained by a punching operation, which includes also provides the three peripheral tabs 31, 32, 33 extending from the main body of the woven mesh center vane 30. The conductive foils 40 which are in the shape of annular rings are fixed to the outer edges of the discs 20 by a suitable conductive adhesive material. Materials other than polyester filaments such as fiber glass filament may be used, provided that such materials have the necessary stiffness to provide strength in the radial direction of the bender structure.

While a particular embodiment of the present invention, including a bender structure and a method of producing such a bender structure has been shown and described, it should be understood that the invention is not limited thereto since many modifications may be made. It is therefore contemplated to cover by the present application any and all such modifications that fall within the true spirit and scope of the basic underlying principles disclosed and claimed herein.

I claim:
1. A bender transducer comprising:
   a first element deformable in response to an applied electronic signal, said element having a conductive interface surface portion;
   a second element having substantially the same dimensions as the first element and having a conductive interface surface portion; and
   a woven mesh of conductively coated stiff non-metallic filaments mounted between the interface portions of the first and the second elements so that the mesh is in contact with the first and the second elements tightly coupling the elements together.
2. The bender of claim 1 wherein the first element is an electromechanical transducer element selected from the group consisting of magnetostrictive, piezoelectric, and electrostrictive transducers.
3. The transducer of claim 2 wherein the second element is an element of the same type and general configuration as the first element.
4. The transducer of claim 1 wherein the mesh is a mesh of stiff filaments, the mesh providing for predetermined spacing between the elements.
5. The transducer of claim 4 wherein the mesh includes peripheral portions for supporting the transducer.
6. The transducer of claim 1 wherein the first and second elements are thin piezoelectric discs each having a first and a second axially opposing face with conductive electrodes deposited thereon.
7. An improved bender having a first piezoelectric disc with a pair of flat axially opposing faces, each face having electrodes deposited thereon, said bender having a second disc with substantially the same dimensions as the first disc, the improvement comprising:
   a conductively coated mesh of a predetermined thickness of stiff non-metallic filaments and positioned between the first and the second discs to provide contact therewith and to permit relative motion therebetween.
8. A bender comprising:
   a pair of piezoelectric element having a pair of flat opposing faces with electrodes deposited thereon; and
   a mesh conductively coated stiff non-metallic filaments, said mesh being coextensive with the piezoelectric elements and being affixed to one side of each of the pair of piezoelectric elements to space apart and hold the piezoelectric elements in parallel relationship.
9. The bender of claim 8 wherein the mesh is formed from polyester filaments.

10. The bender of claim 8 wherein the piezoelectric elements are affixed to the mesh with an adhesive means.

11. The bender of claim 8 wherein the mesh has peripheral portions extending therefrom to provide mounting for the bender.

12. The bender of claim 11 wherein the peripheral portions of the mesh include a plurality of mounting tabs.

13. The bender of claim 8 including electrical conductors which are affixed to the electrodes on the external faces of the piezoelectric elements to provide electrical connection for the bender.

14. The bender of claim 13 wherein the electrical conductors are thin foils having predetermined configurations.

15. An improved piezoelectric acoustic transducer comprising:
   a pair of piezoelectric disc elements each having a pair of flat opposing faces with electrodes deposited thereon;
   a mesh of conductively coated stiff non-metallic filaments, the mesh being coextensive with the piezoelectric elements, said mesh being affixed to and making contact with one side of each of the pair of piezoelectric elements to predeterminely space apart the piezoelectric elements, forming a bimorph bender, the mesh having a plurality of tabs extending from the periphery thereof to provide support for the transducer;
   a pair of conducting foils each affixed to one of the outer faces of the bimorph bender to permit a potential to be applied between the conductive mesh and the foils;
   a diaphram cone having an apex affixed to the center of one of the piezoelectric disc element surfaces and having a peripheral edge; and
   a support member to which are fixed the plurality of tabs extending from the thin layer and to which are fixed the peripheral edge of the cone.

16. A method of making a bender transducer comprising the steps of:
   coating a mesh of stiff non-metallic filaments, said mesh having a conductive layer deposited thereon, with an epoxy;
   assembling a pair of piezoelectric elements, each element having opposing flat faces with electrodes deposited thereon, to opposite sides of the conductive mesh; and
   applying heat and pressure to soften and then cure the epoxy and to cause filaments of the mesh to contact the faces of the piezoelectric elements thereby forming a bender assembly.

17. The method of claim 16 including the step of supporting the assembled piezoelectric element and the conductive mesh by a plurality of peripheral tabs extending from the mesh.

18. The method of claim 16 including the step of affixing thin conductive foils to the outer faces of the piezoelectric elements of the bender assembly.

* * * * *